US006927010B2

(12) United States Patent
Matsuzawa

(10) Patent No.: US 6,927,010 B2
(45) Date of Patent: Aug. 9, 2005

(54) RESIST MATERIAL AND EXPOSURE METHOD

(75) Inventor: Nobuyuki Matsuzawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 148 days.

(21) Appl. No.: 10/317,700

(22) Filed: Dec. 12, 2002

(65) Prior Publication Data

US 2003/0180656 A1 Sep. 25, 2003

(30) Foreign Application Priority Data

Dec. 19, 2001 (JP) ........................................ 2001-385966

(51) Int. Cl.$^7$ .............................................. G03F 7/004
(52) U.S. Cl. ..................... 430/270.1; 430/325; 430/907
(58) Field of Search .............................. 430/270.1, 907, 430/325

(56) References Cited

FOREIGN PATENT DOCUMENTS

WO    WO 2002/090423    * 11/2002

* cited by examiner

*Primary Examiner*—Rosemary Ashton
(74) *Attorney, Agent, or Firm*—Robert J. Depke; Trexler, Bushnell, Blackstone, Giangiorgi & Marr

(57) ABSTRACT

The present invention employs a polymer material exhibiting a low absorbance in the wavelength range of a vacuum ultraviolet (VUV) light to allow the improved ultra-fine process to be realized. In an exposure method for selectively exposing a resist layer to an ultraviolet light to pattern the resist layer into a predetermined shape, a polymer material, to which a cyclopentane group is introduced, is used as a polymer material constituting the resist layer, wherein at least one hydrogen atom of the introduced cyclopentane group is substituted by at least one selected from the group consisting of a fluorine atom, a trifluoromethyl group and a difluoromethylene group.

23 Claims, 1 Drawing Sheet

— CYCLOPENTANE
······ MONOFLUOROCYCLOPENTANE
— 1,1-DIFLUOROCYCLOPENTANE
······ 1,1,2,2-TETRAFLUOROCYCLOPENTANE
||| 1,1,3,3-TETRAFLUOROCYCLOPENTANE
■ 1,1,2,2,3,3-HEXAFLUOROCYCLOPENTANE
■ 1,1,2,2,4,4- HEXAFLUOROCYCLOPENTANE

RESIST MATERIAL AND EXPOSURE METHOD

CROSS REFERENCE TO RELATED APPLICATIONS

The present document is based on Japanese Priority Document JP2001-385966, filed in the Japanese Patent Office on Dec. 19, 2001, the entire contents of which being incorporated herein by reference.

BACKGROUND OF THE INVENTION

1. Field of the Invention

The present invention relates to a resist material and an exposure method for, for example, microfabrication in the field of semiconductor.

2. Description of Related Art

In the field of semiconductor, for example, with the improvement in the degree of integration of semiconductor devices, there is an urgent need to establish a new process technique allowing the processing of an ultra-fine pattern on the order of, for example, 0.1 µm or less.

For the fine pattern processing, a so-called lithography technique is indispensable. In order to realize the ultra-fine processing, lithography techniques utilizing a g-line and an i-line emitted from a conventional mercury lamp or an ultraviolet light emitted from a KrF (Krypton-Fluoride: wavelength of 248 nm) excimer laser and an ArF (Argon-Fluoride: wavelength of 193 nm) excimer laser have been applied in the industry to reduce a wavelength of exposure light so as to improve an optical resolution. These techniques are applied only to the fabrication of devices according to a design rule of 0.13 µm or more because of the limitation of resolution due to the utilized wavelength.

Thus, there is a pressing need to develop a new lithography technique which allows fabrication of devices according to a design rule of 0.1 µm or less. For this purpose, the development of a new exposure technique using a vacuum ultraviolet (hereinafter, abbreviated as VUV) light having a wavelength of 170 nm or less has been energetically advanced. The VUV light has a further shorter wavelength than that of an exposure light emitted from the light source which has been used in conventional lithography techniques. As a specific light source, the development of a lithography technique using an $F_2$ (fluoride dimer) excimer laser (wavelength: 157 nm) is advanced as a successor technique of the existing ArF lithography. Furthermore, as a successor technique of an $F_2$ lithography, a lithography technique using an $Ar_2$ (argon dimer) excimer laser (wavelength: 126 nm) has been proposed.

In the wavelength range of the above VUV light, however, normal organic materials which are conventionally used as resist materials exhibit a high optical absorbance. Accordingly, there arises a problem in that radiated light does not reach the lower portion of a resist layer, failing to form a good rectangular resist pattern. As a result, the resist pattern is degraded. More specifically, since resins such as novolac resins (for i-line lithography), polyhydroxystyrene resins (for KrF lithography) and acrylic resins (for ArF lithography), each of which serves as a main skeleton of a polymer constituting the existing resist material, have a high absorbance in the VUV light range. Therefore, such resins cannot be used as resist materials for VUV lithography.

Thus, as a conventional measure for dealing with the degradation of the resist pattern, a transmittance of the entire resist layer has been improved by reducing a thickness of the resist film to about 70 nm or less. However, such a measure has disadvantages in that a sufficient etching resistance cannot be obtained for the reduced thickness of the resist film and in that the number of defective resist layers is increased due to the reduction in thickness.

As another measure for coping with the degradation problem of the resist pattern, a surface imaging method along with a silylation reaction and the like has been employed. Although the surface imaging method has a low transmittance, it enables the patterning. However, the surface imaging method has disadvantages in that an edge roughness of a resist pattern occurs remarkable and in that the dimension control is not sufficient.

SUMMARY OF THE INVENTION

In view of the above conventional problems, the present invention provides a resist material using a polymer material having a low absorbance in the wavelength range of a vacuum ultraviolet (VUV) light. Moreover, the present invention has another object of providing an exposure method allowing the improved ultra-fine processing by using the resist material.

The present invention relates to a method of efficiently lowering the absorption of an alicyclic hydrocarbon ring (hereinafter, frequently referred to as "alicylic group") in the range of VUV light. The alicyclic group is used because, although both the aromatic ring and the alicyclic group serve to maintain the etching resistance, the alicyclic group tend to be more transparent. The present invention relates to a method of efficiently lowering the absorption particularly in a case where a cyclopentane group is used as the alicyclic group.

More specifically, a resist material according to the present invention contains a polymer material having a cyclopentane group as an alicyclic group, wherein at least one hydrogen atom of the cyclopentane group is substituted by any one selected from the group consisting of a fluorine atom, a trifluoromethyl group, and a difluoromethylene group.

In an exposure method according to the present invention, for selectively exposing a resist layer to an ultraviolet light so as to pattern the resist layer into a predetermined shape, a polymer material having introduced thereinto a cyclopentane group is used as a polymer material constituting the resist layer, wherein at least one hydrogen atom of the cyclopentane group is substituted by at least one selected from the group consisting of a fluorine atom, a trifluoromethyl group and a difluoromethylene group.

In the present invention, a sufficiently transparent alicyclic group is obtained by using a specific polymer material having a cyclopentane group whose at least one hydrogen atom is substituted by a fluorine atom, a trifluoromethyl group or a difluoromethylene group. As a result, it is possible to obtain a resist material having a low absorbance in the range of VUV light while restraining the degradation in adhesion as well as in etching resistance. The exposure is conducted by using such a resist material so as to pattern a resist layer into a predetermined shape, thereby obtaining a good rectangular resist pattern.

The reason for using the above-mentioned specific polymer material is described as follows. An aromatic ring or an alicyclic group is normally introduced into a polymer material constituting a resist material so as to maintain the etching resistance. More specifically, a novolac resin serving as a resin for i-line lithography and a polyhydroxystyrene resin serving as a resin for KrF lithography are both resins having an aromatic ring. To an acrylic resin for ArF lithography, an alicyclic group is introduced instead of an aromatic ring because the aromatic ring exhibits a high absorbance at a wavelength of 193 nm which corresponds to an exposure wavelength of ArF lithography. However, since these aromatic rings and alicyclic groups have a high absorbance in the range of VUV light, they cannot be contained in a polymer material constituting a resist material for VUV lithography as they are.

On the other hand, it is known that the substitution of a hydrogen atom contained in the aromatic rings and the alicyclic group by a fluorine atom, a trifluoromethyl group or a difluoromethylene group allows the substituted aromatic ring or alicyclic group to have a lowered absorbance in the range of VUV light as compared with a case where the substitution is not carried out.

In view of mere reduction of the absorption in the range of VUV light, it is the most desirable to substitute all hydrogen atoms contained in the aromatic ring and the alicyclic group by fluorine atoms, trifluoromethyl groups or difluoromethylene groups. However, since perfluorinated organic materials exhibit remarkably degraded adhesion to a silicon oxide film, an organic or inorganic antireflection film or the like serving as an underlayer of the resist layer, it is not suitable to use the perfluorinated organic materials for the resist material.

More specifically, in view of avoidance of reduction in adherence, it is desirable to restrain a ratio of substituting hydrogen atoms contained in the aromatic ring and the alicyclic group by fluorine atoms, trifluoromethyl groups or difluoromethylene groups as much as possible.

The organic materials tend to have a lowered etching resistance with increase in a ratio of hydrogen atoms contained in the organic material substituted by fluorine atoms, trifluoromethyl groups or difluoromethylene groups. Also in light of this tendency, it is desirable to restrain a ratio of hydrogen atoms contained in the aromatic ring and the alicyclic group substituted by fluorine atoms, trifluoromethyl groups or difluoromethylene groups as much as possible.

As is apparent from the above description, according to the present invention, it is possible to efficiently lower an absorbance of alicyclic groups in the range of VUV light. As a result, a favorable rectangular resist pattern can be obtained, thus enabling a more improved ultra-fine processing than before, for example, realizing processing of an ultra-fine pattern 0.1 $\mu$m or less.

DESCRIPTION OF THE PREFERRED EMBODIMENTS

Figure 1:
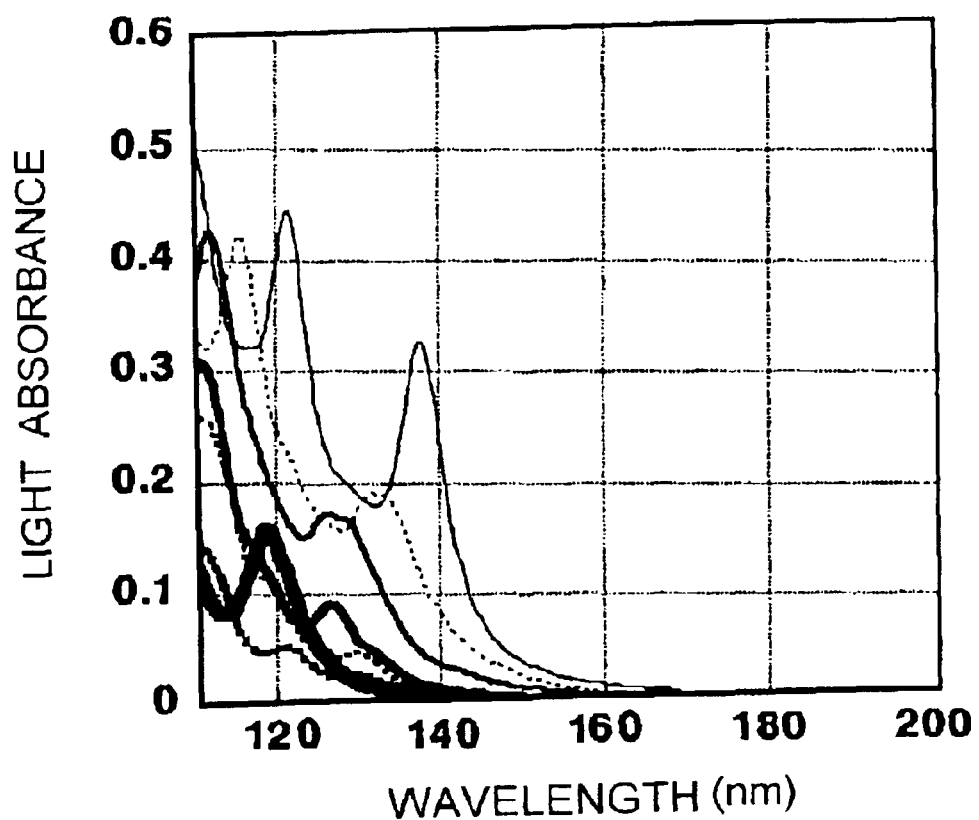
FIG. 1 is a graph showing the result of calculation of absorption spectra within the range of a vacuum ultraviolet light by using the density functional theory, for 1,1-difluorocyclopentane, 1,1,2,2-tetrafluorocyclopentane, 1,1,3,3-tetrafluorocyclopentane, 1,1,2,2,3,3-hexafluorocyclopentane, 1,1,2,2,4,4-hexafluorocyclopentane, monofluorocyclopentane and cyclopentane.
Figure 1:
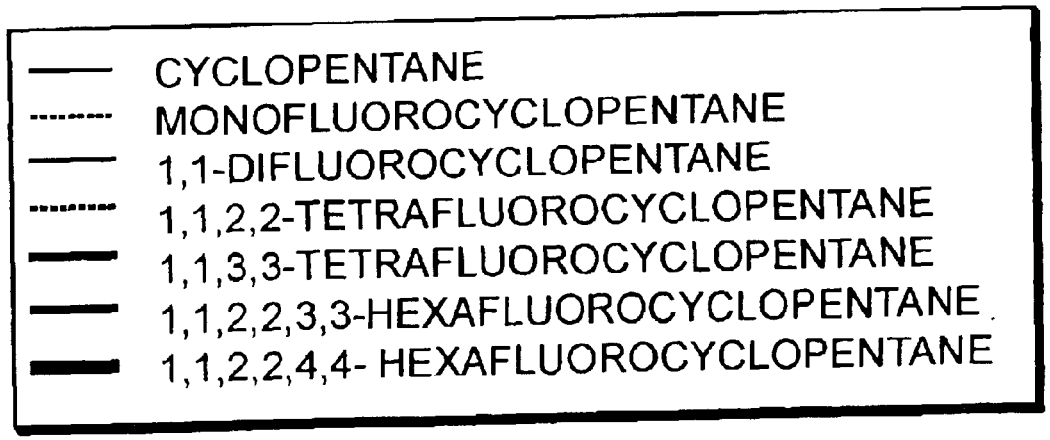

Hereinafter, an exposure method, to which the present invention is applied, will be described in detail with reference to the accompanying drawing.

An exposure method of the present invention is applied to, for example, processing of an ultra-fine pattern in semiconductor devices. More specifically, the exposure method includes the steps of: applying a resist material having a photosensitive effect onto a substrate so as to form a resist layer; selectively exposing the resist layer to a vacuum ultraviolet light so as to expose the resist layer; and forming the resist layer in a predetermined pattern by development.

Although a VUV light having an arbitral wavelength can be used as a VUV light for exposure, use of a VUV light having a specific wavelength (110 to 170 nm) permits the improved resolution performance to be obtained in particular. More desirably, the VUV light suitably has an exposure wavelength within the range of 120 nm to 165 nm. Specifically, a VUV light having a wavelength of 157 nm emitted from an $F_2$ (fluoride dimer) excimer laser serving as a light source, or a VUV light having a wavelength of 126 nm emitted from an $Ar_2$ (argon dimer) excimer laser serving as a light source can be used.

As polymer materials used for the resist layer, polymer materials containing a cyclopentane group are employed. For example, the used polymer material includes at least one resin selected from the group consisting of a novolac resin containing a cyclopentane group, a polyhydroxystyrene resin containing a cyclopentane group, an acrylic resin containing a cyclopentane group, a siloxane resin containing a cyclopentane group, a silsesquioxane resin containing a cyclopentane group, a polycycloolefin resin containing a cyclopentane group, and the like as a main skeleton. Polynorbornanes also fall within the scope of the present invention because polynorbornanes have a saturated five-membered hydrocarbon ring in a part of a norbornane structure.

In the present invention, one or more hydrogen atom of a cyclopentane group contained in the polymer material as described above is substituted by one selected from the group consisting of: a fluorine atom, a trifluoromethyl group and a difluoromethylene group.

At least one hydrogen atom selected from the remaining hydrogen atoms unsubstituted of the cyclopentane group may be substituted by the other groups, for example, an alkyl group, a halogen atom other than the fluorine atom, an amino group, a nitro group, a methylene group and a derivative thereof as long as an absorption coefficient of the entire resist layer at a VUV light wavelength for exposure is 5 $\mu m^{-1}$ or less. In a case where two or more hydrogen atoms of the remaining hydrogen atoms of the cyclopentane group are substituted by substituent groups other than the fluorine atom, these substituent groups may be either different from each other or the same. Furthermore, these substituent groups may also be bonded to each other.

As a polymer material used for the resist layer, a polymer material containing the above-mentioned cyclopentane groups may be used by itself. Moreover, depending on a case, a photoacid generator for improving the exposure sensitivity, a dissolution inhibitor for improving the development characteristics, a crosslinking agent for improving the resolution characteristics and the like may be added to the polymer material. These additives may be contained in the polymer material at any ratio as long as an absorption coefficient of the entire resist layer at a wavelength of a VUV light for exposure is 5 $\mu m^{-1}$ or less. A preferable weight percent of the additive is, however, 25% by weight or less with respect to the polymer material used for the resist layer. If a larger amount of the additive is contained in the polymer material, the resolution performance as the entire resist material may be possibly lowered in some cases.

The polymer material containing a cyclopentane group may further contain a group being capable of undergoing a chemical reaction by radiation of light to provide the resolution performance. The group may be an ester group, a phenolic hydroxyl group, an alcoholic hydroxyl group, a carboxyl group, a flurorinated ester group, a fluorinated-phenolic hydroxyl group, a fluorinated-alcoholic hydroxyl group, a fluorinated carboxyl group and the like, or a group constituted by the derivatives thereof. In a case where any of the above groups are not contained in the polymer material, the resolution performance may alternatively obtained by utilizing a chemical reaction of the cyclopentane group itself caused by radiation of light, or a chemical reaction in a main skeleton of the polymer material caused by radiation of light.

In the present invention, a film made of a material other than silicon and silicon oxide such as an organic or inorganic anti-reflection film or a hard mask may be additionally provided between the resist layer and a substrate made of silicon or the like.

A thickness of the resist layer is 70 nm or more, preferably, 100 nm or more. With such a thickness, the etching resistance can be ensured to provide a high-quality resist layer with few defects. It is apparent that the patterning of the resist layer can be performed even with the resist layer having a thickness of less than 70 nm by using the material according to the present invention. In such a case, however, there is a possibility that good etching cannot be performed in the etching process following the patterning of the resist layer due to a too small thickness of the resist layer.

The reason why a fluorinated, trifluoromethylated, or difluoromethylenated cyclopentane group according to the present invention is more transparent than a cyclopentane group without any substitution for the hydrogen atom will be described below. As examples of a fluorinated, trifluoromethylated, or difluoromethylenated cyclopentane group according to the present invention, 1,1-difluorocyclopentane, 1,1,2,2-tetrafluorocyclopentane, 1,1,3,3-tetrafluorocyclopentane, 1,1,2,2,3,3-hexafluorocyclopentane, 1,1,2,2,4,4-hexafluorocyclopentane, and monofluorocyclopentane are taken. As an example of a cyclopentane group without substitution, cyclopentane is taken.

For the above seven molecules, the energy value was derived by theoretical calculation. In the calculation, first, geometry optimization of each of the molecules is carried out by employing the density functional theory which is one of the ab initio molecular orbital methods. As a result, the optimized geometry is obtained for each of the molecules. As the density functional theory, the correlation potential of Vosko-Wilk-Nusair (reference: S. H. Vosko, L. Wilk, M. Nusair, Can. J. Phys., 58. 1980, 1200) is employed, whereas the 6-31G*basis function (references: P. C. Hariharan, J. A. Pople, Theoret. Chim. Acta, 28, 1973, 213; and M. M. Francl, W. J. Petro, W. J. Herhre, J. S. Binkley, M. S. Gordon, D. J. DeFree, J. A. Pople, J. Phys. Chem., 77, 1982, 3654) is used as a basis function necessary for the calculation.

With the use of the thus obtained optimized geometry, a theoretical calculation of an absorption spectrum is performed with the application of a time-dependent density functional theory (references: R. Bauernschmitt, R. Ahlrichs, Chem. Phys. Lett., 256, 1996, 454; and M. E. Casida, C. Jamorski, K. C. Casida, D. R. Salahub, J. Chem. Phys., 108, 1998, 4439) which is one of the density functional theories. In the calculation according to the time-dependent density functional theory, the correlation potential of Vosko-Wilk-Nusair (reference: S. H. Vosko, L. Wilk, M. Nusair, Can. J. Phys., 58. 1980, 1200) is employed again.

The employed basis function is obtained by adding the Rydberg basis function (reference: T. H. Dunning Jr., P. J. Harrison, In Modern Theoretical Chemistry, Vol. 2, Ed.: H. F. Schaefer III, Plenum Press, New York, 1977) to the DZ basis function (reference: T. H. Dunning Jr., J. Chem. Phys., 53, 1970, 2823).

For the calculation according to the density functional theory, the program Gaussian 98 (Gaussian 98,Revision A. 7, M. J. Frisch, G. W. Trucks, H. B. Schlegel, G. E. Scuseria, M. A. Robb, J. R. Cheeseman, V. G. Zakrzewski, J. A. Montogomery Jr., R. E. Stratmann, J. C. Burant, S. Dappich, J. M. Millam, A. D. Daniels, K. N. Kudin, M. C. Strain, O. Farkas. J. Tomasi, V. Barone, M. Cossi, R. Cammi, B. Mennucci, C. Pomelli, C. Adamo, S. Clifford, J. Ochterski, G. A. Petersson, P. Y. Ayala, Q. Cui, K. Morokuma, D. K. Malick, A. D. Rabuck, K. Raghavachari, J. B. Foresman, J. Cioslowski, J. V. Ortiz, A. G. Baboul, B. B. Stefanov, G. Liu, A. Liashenko, P. Piskorz, I. Komaromi, R. Gomperts, R. L. Martin, D. J. Fox, T. Keith, M. A. Al-Laham, C. Y. Peng, A. Nanayakkara, C. Gonzalez, M. Challacombe, P. M. W. Gill, B. Johnson, W. Chen, M. W. Wong, J. L. Andres, C. Gonzalez, M. Head-Gordon, E. S. Replogle, J. A. People, Gaussian, Inc., Pittsburgh, Pa., 1988) is employed.

FIG. 1 shows the result of calculation of absorption spectra within the range of a vacuum ultraviolet light for 1,1-difluorocyclopentane, 1,1,2,2-tetrafluorocyclopentane, 1,1,3,3-tetrafluorocyclopentane, 1,1,2,2,3,3-hexafluorocyclopentane, 1,1,2,2,4,4-hexafluorocyclopentane, monofluorocyclopentane and cyclopentane, the result being obtained by actually employing the density functional theory.

As is understood from FIG. 1, each of the molecules of fluorinated cyclopentanes exhibits a low absorbance value of about 0.01 or less at a wavelength of 157 nm, which corresponds to a wavelength of the fluoride dimer excimer laser. On the other hand, non-fluorinated cyclopentane exhibits a high absorbance value of about 0.02. It is understood from these results that the absorbance of cyclopentanes can be remarkably reduced by substitution of fluorine.

Embodiment

Hereinafter, a specific embodiment, to which the present invention is applied, will be described based on the experimental result.

The absorption spectrum of each of cyclopentane, monofluorocyclopentane and trifluorocyclopentane was measured in the range of VUV light. A measurement apparatus for the absorption spectrum is fabricated by the inventor of the present invention. A deuterium lamp (30 W) was used as a light source, and an $MgF_2$ lens was used as a light source optical system. For a spectroscope section, a concave diffraction grating having 1200 grooves/mm (with an $MgF_2$ coating) was used. A reciprocal linear dispersion thereof was about 4 nm and a measurement wavelength range was 125 to 300 nm. In a sample chamber kept under vacuum, a semi-double beam measurement was possible. A gas cell with a window made of $MgF_2$ was placed in the sample chamber. A gas of sample molecules which was controlled in terms of temperature as well as of pressure was introduced into the gas cell, where the measurement was carried out. A toroidal mirror was used as a condenser mirror. A pressure in a vacuum part of the sample chamber was about $4\times10^{-5}$ Torr. As a detector, a 6199 type photomultiplier fabricated by JASCO Corporation, Japan, was used.

As the result of measurement, Table 1 shows the absorbances of cyclopentane, monofluorocyclopentane and trifluorocyclopentane at a wavelength of 157 nm. It is noted that the values shown in Table 1 are obtained by normalizing the absorbances at a wavelength of 157 nm for 1 μm thickness of a solid film.

TABLE 1

| Cyclopentane | 5.1 μm$^{-1}$ |
|---|---|
| Monofluorocyclopentane | 2.0 μm$^{-1}$ |
| Trifluorocyclopentane | 1.8 μm$^{-1}$ |

As is apparent from Table 1, the absorbances of monofluorocyclopentane and trifluorocyclopentane according to the present invention are certainly lowered as compared with conventional cyclopentane to which the present application is not applied. As a result, it is understood that the absorbances of 5 μm$^{-1}$ or less, which are necessary for the resist material, are obtained in the present invention.

Thus, according to the present invention, it is possible to efficiently lower the absorption of alicyclic groups in the range of VUV light. As a result, it is possible to provide a resist material for a new process technique allowing the processing of an ultra-fine pattern on the order of, for example, 0.1 μm or less.

Although cyclopentane is taken as an example of alicyclic groups in the above-described embodiment, the present invention is not limited thereto. The present invention is applicable to, for example, other alicyclic groups containing a cyclopentane group (for example, norbornanes and tricyclodecanes) and the like. Accordingly, an ultra-fine process with the further improved fineness, for example, an ultra-fine pattern on the order of 0.1 μm or less, can be realized.

What is claimed is:

1. A resist material comprising a polymer material having a cyclopentane group as an alicyclic group, wherein at least one hydrogen atom of said cyclopentane group is substituted by any one selected from the group consisting of a fluorine atom, a trifluoromethyl group, and a difluoromethylene group.

2. The resist material according to claim 1, wherein at least one hydrogen atom of remaining hydrogen atoms of said cyclopentane group is substituted by a substituent group other than said fluorine atom.

3. The resist material according to claim 2, wherein at least two hydrogen atoms of said remaining hydrogen atoms of said cyclopentane group are substituted by substituent groups other than said fluorine atom.

4. The resist material according to claim 3, wherein said substituent groups are the same.

5. The resist material according to claim 3, wherein each of said substituent group is either one of a methylene group and a derivative thereof.

6. The resist material according to claim 3, wherein said substituent groups are different.

7. The resist material according to claim 3, wherein said substituent groups are bonded to each other.

8. The resist material according to claim 1, wherein said polymer material comprises at least one resin selected from the group consisting of a novolac resin, a polyhydroxystyrene resin, an acrylic resin, a siloxane resin, a silsesquioxane resin and a polycycloolefin resin as a main skeleton.

9. The resist material according to claim 1, wherein said polymer material contains a group being capable of undergoing a chemical reaction due to light irradiation.

10. The resist material according to claim 1, wherein said resist material contains at least one selected from the group consisting of a photoacid generator, a dissolution inhibitor and a crosslinking agent as an additive.

11. The resist material according to claim 10, wherein a content of said additive is 25% by weight or less.

12. The resist material according to claim 1, wherein said polymer material has an absorption coefficient of 5 μm$^{-1}$ or less at a wavelength of a vacuum ultraviolet (VUV) light.

13. The resist material according to claim 1, wherein said resist material has an absorption coefficient of 5 μm$^{-1}$ or less at a wavelength of a vacuum ultraviolet (VUV) light.

14. An exposure method comprising a step of subjecting a resist layer to selective exposure to an ultraviolet light so as to pattern said resist layer into a predetermined shape, wherein a polymer material, to which a cyclopentane group is introduced, is used as a polymer material constituting said resist layer, at least one hydrogen atom of said cyclopentane group being substituted by at least one selected from the group consisting of a fluorine atom, a trifluoromethyl group and a difluoromethylene group.

15. The exposure method according to claim 14, wherein said polymer material comprises at least one resin selected from the group consisting of a novolac resin, a polyhydroxystyrene resin, an acrylic resin, a siloxane resin, a silsesquioxane resin and a polycycloolefin resin as a main skeleton.

16. The exposure method according to claim 14, wherein said polymer material contains a group being capable of undergoing a chemical reaction due to light irradiation.

17. The exposure method according to claim 14, wherein said resist layer contains at least one selected from the group consisting of a photoacid generator, a dissolution inhibitor and a crosslinking agent as an additive.

18. The exposure method according to claim 17, wherein a content of said additive is 25% by weight or less.

19. The exposure method according to claim 14, wherein said polymer material has an absorption coefficient of 5 μm$^{-1}$ or less at a wavelength of a vacuum ultraviolet (VUV) light.

20. The exposure method according to claim 14, wherein said resist layer has an absorption coefficient of 5 μm$^{-1}$ or less at a wavelength of a vacuum ultraviolet (VUV) light.

21. The exposure method according to claim 14, wherein a vacuum ultraviolet light is used as said ultraviolet (VUV) light.

22. The exposure method according to claim 21, wherein said vacuum ultraviolet (VUV) light has a wavelength of 110 to 170 nm.

23. The exposure method according to claim 21, wherein a fluoride dimer ($F_2$) excimer laser is used as a light source of said vacuum ultraviolet (VUV) light.

* * * * *